United States Patent [19]
Guha et al.

[11] Patent Number: 4,600,801
[45] Date of Patent: Jul. 15, 1986

[54] FLUORINATED, P-DOPED MICROCRYSTALLINE SILICON SEMICONDUCTOR ALLOY MATERIAL

[75] Inventors: Subhendu Guha, Clawson; James Kulman, Detroit, both of Mich.

[73] Assignee: Sovonics Solar Systems, Troy, Mich.

[21] Appl. No.: 667,659

[22] Filed: Nov. 2, 1984

[51] Int. Cl.⁴ .................. H01L 31/06; H01L 31/18
[52] U.S. Cl. .................. 136/249; 136/258; 252/62.3 R; 252/501.1; 357/30; 357/59; 420/578; 420/903; 427/39; 427/74; 427/86
[58] Field of Search ............. 252/62.3 R, 501.1; 420/578, 556, 903; 136/258 AM, 249 TJ, 258 PC; 357/2, 30, 59; 427/39, 74, 86

[56] References Cited
U.S. PATENT DOCUMENTS 4,398,343 8/1983 Yamazaki ..................... 29/585
4,409,134 10/1983 Yamazaki ..................... 252/501.1
4,433,202 2/1984 Maruyama et al. ............ 136/255
4,496,788 1/1985 Hamakawa et al. ............ 136/249 TJ

OTHER PUBLICATIONS

G. Bruno et al, *Thin Solid Films,* vol. 106, pp. 145–152 (1983).
Y. Osaka et al, Chapter 3.3, pp. 80–97 of JARECT vol. 16, Amorphous Semiconductor Technologies & Devices (1984) Y. Hamakawa, editor, Omsha Ltd & North-Holland Pub. Co.

*Primary Examiner*—Aaron Weisstuch
*Attorney, Agent, or Firm*—Marvin S. Siskind; Ronald W. Citkowski

[57] ABSTRACT

A fluorinated, p-doped microcrystalline semiconductor alloy material; electronic devices incorporating said p-doped material; and the method for fabricating said p-doped material.

46 Claims, 4 Drawing Figures

FLUORINATED, P-DOPED MICROCRYSTALLINE SILICON SEMICONDUCTOR ALLOY MATERIAL

FIELD OF THE INVENTION

This invention relates generally to thin film semiconductor alloys and more particularly to fluorinated, p-doped, microcrystalline semiconductor alloys, as well as processes for manufacturing said alloy layers and semiconductor devices incorporating said alloy layers.

BACKGROUND OF THE INVENTION

Thin film semiconductor alloys have gained growing acceptance as a material from which to fabricate electronic devices such as photovoltaic cells, photoresponsive and photoconductive devices, transistors, diodes, integrated circuits, memory arrays and the like. This is because the thin film semiconductor alloys (1) can be manufactured at relatively low cost, (2) possess a wide range of controllable electrical, optical and structural properties and (3) can be deposited to cover relatively large areas.

Recently, considerable effort has been expended to develop systems and processes for depositing thin film semiconductor alloy materials which encompass relatively large areas and which can be doped so as to form p-type and n-type semiconductor alloy layers for the production therefrom of thin film electronic devices, particularly thin film p-n type and p-i-n type photovoltaic devices which would be substantially operatively equivalent or superior to their crystalline counterparts. Among the investigated semiconductor alloy materials of the greatest significance are the silicon, germanium, and silicon-germanium based alloys. Such semiconductor alloys have been the subject of a continuing development effort on the part of the assignee of the instant invention, said alloys being utilized and investigated as possible candidates from which to fabricate thin films of amorphous, microcrystalline, and also polycrystalline material.

As disclosed in U.S. Pat. No. 4,226,898 of Ovshinsky, et al, which patent is assigned to the assignee of the instant invention and the disclosure of which is incorporated herein by reference, fluorine introduced into the silicon alloy semiconductor layers operates to substantially reduce the density of the localized defect states in the energy gap thereof and facilitates the addition of other alloying materials, such as germanium. As a result of introducing fluorine into the host matrix of the semiconductor alloy, the film so produced can have a number of favorable attributes similar to those of single crystalline materials. A fluorinated thin film semiconductor alloy can thereby provide high photoconductivity, increased charge carrier mobility, increased diffusion length of charge carriers, low dark intrinsic electrical conductivity, and, where desired, such alloys can be modified to help shift the Fermi level to provide substantially n- or p-type extrinsic electrical conductivity. Thus, fluorinated thin film semiconductor alloy materials can be fabricated in manner which allows them to act like crystalline materials and be useful in devices, such as, solar cells and current controlling devices including diodes, transistors and the like.

Unlike crystalline silicon which is limited to batch processing for the manufacture of solar cells, the afore-described, amorphous alloys can be deposited in multiple layers over large area substrates to form solar cells in a high volume, continuous processing system. Such continuous processing systems are disclosed in the following U.S. Patents: U.S. Pat. No. 4,400,409, for A Method Of Making P-Doped Silicon Films And Devices Made Therefrom and U.S. Pat. No. 4,410,588, for Continuous Amorphous Solar Cell Production System; U.S. Pat. No. 4,438,723, for Multiple Chamber Deposition And Isolation System And Method. As disclosed in these patents, a substrate may be continuously advanced through a succession of interconnected, environmentally protected deposition chambers, wherein each chamber is dedicated to the deposition of a specific semiconductor material. In making a photovoltaic device, for instance, of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. The layers of semiconductor alloy material thus deposited in the vacuum envelope of the deposition apparatus may be utilized to form photoresponsive devices, such as, but not limited to photovoltaic cells which include one or more p-i-n type cells. Note that as used herein the term "p-i-n type" will refer to any sequence of p and n or p, i, and n semiconductor alloy layers. Additionally, by making multiple passes through the succession of deposition chambers, or by providing an additional array of deposition chambers, multiple stacked cells of various configurations may be obtained.

The concept of utilizing multiple stacked cells, to enhance photovoltaic device efficiency, was described at least as early as 1955 by E. D. Jackson in U.S. Pat. No. 2,949,498 issued Aug. 16, 1960. The multiple cell structures therein disclosed utilized p-n junction single crystalline semiconductor devices. Essentially, the concept employed different band gap devices to more efficiently collect various portions of the solar spectrum and to increase open circuit voltage ($V_{oc}$). The tandem cell device (by definition) has two or more cells with the light directed serially through each cell. In the first cell a large band gap material absorbs only the short wavelength light, while in subsequent cells smaller band gap materials absorb the longer wavelengths of light which pass throught the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film amorphous, microcrystalline, and polycrystalline semiconductor alloy materials, such as the microcrystalline p-doped semiconductor alloy material of the instant invention.

It is now possible to manufacture high quality n-doped and intrinsic thin film semiconductor alloy layers utilizing techniques developed by the assignee of the instant invention. However, the p-doped thin film semiconductor alloy layers heretofore fabrication have, in many instances, been of less than the optimum quality required for the manufacture of the highest efficiency electronic devices therefrom. Accordingly, because of the limitations imposed by the p-doped semiconductor alloy material, the optimum operational potential of many classes of thin film semiconductor alloy devices have as yet to be achieved.

For example, if a highly transparent, wide band gap, microcrystalline, p-doped semiconductor alloy layer (also referred to as a highly "p-doped layer") could be fabricated, p-i-n and n-i-p type photovoltaic cells manufactured with said microcrystalline, p-doped semiconductor alloy layer would exhibit significant improvement in the operational performance thereof. Such a highly p-doped layer would have a low activation energy and would thus increase the magnitude of the electrical field established across the intrinsic semiconductor alloy layer by the oppositely disposed p-doped layer and n-doped layer, thereby improving the fill factor of the photovoltaic cell. Similarly, the built-in potential of the photovoltaic cell, and consequently, the open circuit voltage generated thereacross would be increased by the presence of the highly p-doped, microcrystalline, semiconductor alloy layer. The improved electrical conductivity of microcrystalline p-doped semiconductor alloy material, vis-a-vis similarly constituted and doped amorphous semiconductor alloy material, would further provide for decreased series resistance encountered by charge carriers in their movement through the photovoltaic cell. The decrease in series resistance would result in improved fill factor and overall efficiency of that photovoltaic cell.

Furthermore, wide band gap, p-doped microcrystalline semiconductor alloy layers are more optically transparent than corresponding amorphous semiconductor alloy layers. Such transparency is desirable, if not essential, in the p-doped layer of a p-i-n type photovoltaic cell because increased transparency allows more light, whether incident upon the p-doped layer or redirected by a back reflector through that p-doped layer, to pass therethrough for absorption in the intrinsic semiconductor alloy layer of the photovoltaic cell. It is in this intrinsic semiconductor alloy layer that charge carrier pairs are most efficiently generated. Therefore, photovoltaic cells employing microcrystalline, wide band gap, p-doped layers of semiconductor alloy material would also produce higher short circuit currents. This consideration of transparency would be especially significant for a tandem p-i-n type photovoltaic device, described hereinabove, which cells are formed of a multiplicity of stacked, individual p-i-n type photovoltaic cells. This is because, in such a tandem photovoltaic device, a light absorbing (narrow band gap) p-doped layer in (1) the upper photovoltaic cell would "shade" one or more of the underlying cells and thus reduce the amount of incident light absorbed in the intrinsic semiconductor alloy layer, the layer with the longest lifetime for charge carriers thereof, and (2) the lower photovoltaic cell would "shade" one or more of the superposed cells and thus reduce the amount of redirected light absorbed in the intrinsic semiconductor alloy layer.

As should thus be apparent, if it would be possible to fabricate a microcrystalline p-doped semiconductor alloy material having a wide band gap, high electrical conductivity and low activation energy, said p-doped semiconductor alloy material would prove to be very beneficial in the manufacture of photovoltaic devices. Similarly, such a p-doped microcrystalline semiconductor alloy material could be advantageously employed in the manufacture of other electronic devices to complement the presently available high conductivity n-type thin film silicon alloy semiconductor material. Obviously, high quality, microcrystalline, p-doped semiconductor alloy materials would have immediate utility in the fabrication of a wide variety of thin film electronic devices such as thin film transistors, diodes, memory arrays and the like. Simply stated, such p-doped microcrystalline semiconductor alloy material could be made to exhibit the high conductivity and wide band gap characteristics of corresponding single crystal semiconductor material and could be made to accept sufficiently high levels of p-dopant material to provide a low activation energy. Further, such p-doped microcrystalline semiconductor alloy materials would not manifest the detrimental properties of large grain boundaries commonly exhibited by polycrystalline semiconductor alloy material; and unlike single crystalline semiconductor alloy materials, they could be produced in a wide range of compositional variations by low cost vapor deposition techniques.

One method for the fabrication of microcrystalline p-doped silicon alloy materials is disclosed by Matsuda, et al in a paper entitled "High-Conductive And Wide Optical-Gap Boron-Doped Si:H Films" published in 1981 by the American Institute of Physics in *Tetrahedrally Bonded Amorphous Semiconductors*, edited by Street, Biegehem and Knights. As described therein, a glow discharge deposition technique is used for the preparation of thin films of boron doped, hydrogenated microcrystalline silicon alloy material from a gaseous precursor mixture of diborane, silane, and hydrogen under high power, low pressure conditions. The resultant p-doped semiconductor alloy was reported to have an optical gap of 1.8 eV, dark conductivity of about 0.1 ohm$^{-1}$cm$^{-1}$, an activation energy of 0.03 eV, and microcrystalline inclusions amounting to 60 volume % in the amorphous network.

While the aforementioned paper of Matsuda, et al discloses a method for the preparation of microcrystalline, p-doped, hydrogenated silicon alloys, said alloys have yet to be optimized for the production of the highest efficency semiconductor devices therefrom. For instance, the conductivity of 0.1 ohm$^{-1}$cm$^{-1}$ remains far below (about at least two orders of magnitude below the value that can be theoretically obtained with microcrystalline p-doped hydrogenated silicon alloy material) and the band gap remains narrower than the band gap of the corresponding intrinsic semiconductor alloy material). It is believed that the technique described by Matsuda, et al provides less than optimized semiconductor alloy material insofar as it (1) fails to incorporate fluorine into the host matrix of the semiconductor alloy material, and (2) relies exclusively upon the use of diborane as the gaseous precursor material from which to provide boron for p-doping the semiconductor alloy material.

First, with respect to the use of diborane, while the fabrication of hydrogenated microcrystalline p-doped semiconductor alloy material is a notable achievement, regardless of the gaseous precursor p-dopant material, the polymeric tendencies of a gaseous diborane precursor under the influence of a glow discharge environment would make it desirable to substitute another gaseous precursor source of a p-dopant material. More particularly, (1) diborane is a relatively expensive, toxic, gaseous material which ignites spontaneously upon contact with the ambient atmosphere, thus necessitating the implementation of special production procedures and the use of expensive, specialized gas handling and storage systems, (2) under glow discharge conditions diborane inherently produces semiconductor species exhibiting less than desirable plasma properties. As fully disclosed in U.S. Patent Application Ser. No. 668,435, filed Nov. 5, 1984, of Yang, et al, which application is assigned to the assignee of the instant invention and the disclosure of which is incorporated herein by reference, diborane, under glow discharge deposition conditions, is characterized by a tendency to incorporate polymeric and oligomeric boron species into the depositing host matrix of the semiconductor alloy material, said higher order boron species deleteriously affecting the chemical, optical, and electronic properties of the resultant semiconductor alloy material. Therefore, it would be desirable to be able to fabricate a thin film microcrystalline, p-doped, wide band gap semiconductor alloy material from a gaseous precursor material other than diborane in order to avoid the formation of the polymeric and oligomeric boron species.

Additionally, and as referred to hereinabove, Matsuda, et al fail to incorporate fluorine into the matrix of their thin microcrystalline p-doped semiconductor alloy films. However, as has been shown by the assignee of Applicants' invention, fluorine introduced into thin film semiconductor alloy materials beneficially affects the chemical, electrical, and optical properties thereof so as to render those thin film semiconductor alloy materials more clearly equivalent to corresponding single crystalline semiconductor materials. Therefore, it would also be desirable to incorporate fluorine into the host matrix of the microcrystalline, p-doped semiconductor alloy material so as to gain all of the aforementioned beneficial characteristics of fluorinated amorphous semiconductor alloy materials. In this regard, note that the disclosure of Matsuda, et al is limited to p-doped wide band gap silicon:hydrogen microcrystalline semiconductor alloys. Matsuda, et al do not discuss, describe, or suggest the production of highly-conductive, wide band gap, p-doped, microcrystalline semiconductor alloy materials which incorporate fluorine into the host matrix thereof.

In summary, it may thus be seen that one method of fabricating higher quality thin film electronic devices than are currently available, would be to incorporate fluorine into the host matrix of the thin film, wide band gap, p-doped, microcrystalline semiconductor alloy materials. And in order to fabricate said fluorinated, wide band gap, p-doped, microcrystalline semiconductor alloy material in a commerically feasible manner, it is necessary to either utilize a preexisting process or develop an economical, high volume, preferably continuous process for the fabrication of said alloys, which process is compatible with processes currently employed for the fabrication of the n-doped and intrinsic layers of thin film semiconductor alloy material.

These and other objects and advantages of the instant invention will be apparent from the detailed description of the invention, the brief description of the drawings and the claims which follow.

BRIEF SUMMARY OF THE INVENTION

There is disclosed herein a fluorinated, p-doped, microcrystalline semiconductor alloy material. In accordance with a first embodiment of the invention, the semiconductor alloy material comprises a microcrystalline host matrix containing at least silicon, said host matrix having incorporated thereinto at least one density of states reducing element and a p-doping element. The semiconductor is preferably a silicon alloy, the p-dopant is boron and the at least one density of states reducing element includes fluorine. The fluorinated, p-doped, microcyrstalline alloy material is characterized by an activation energy of approximately less than 0.05 eV, a conductivity of greater than 1.0 ohms$^{-1}$cm$^{-1}$, a band gap of approximately 2.0 eV, an absorption constant for light of 5500 angstroms of approximately $3 \times 10^4$cm$^{-1}$, 0.5 to 5% fluorine incorporated thereinto, and microcrystalline inclusions amounting to greater than 60 volume % in the amorphous matrix.

In other embodiments of the instant invention, the host matrix of the semiconductor alloy material may preferably comprise a silicon:germanium containing alloy and the microcrystalline semiconductor alloy material may further include hydrogen.

There is also disclosed herein a method of fabricating a fluorinated, p-doped, microcrystalline semiconductor alloy material through the use of a glow discharge deposition process. The method includes the steps of depositing the microcrystalline alloy film upon a substrate through the glow discharge decomposition of a gaseous mixture of at least a semiconductor precursor gas, a dopant precursor gas and a diluent gas; at least one of said precursor gases including fluorine. In a preferred embodiment, the method further includes the step of introducing the gaseous mixture into the glow discharge deposition apparatus in approximately the following proportions: (1) approximately less than 1% of the precursor semiconductor gas, (2) approximately more than 98% of the diluent gas and (3) approximately less than 1% of the precursor p-dopant gas, it being found that the glow discharge decomposition of a gaseous mixture of approximately this composition will produce the wide band gap, fluorinated, microcrystalline semiconductor alloy material of the instant invention.

In a first preferred embodiment of the process of the instant invention, the semiconductor precursor gas is silane, the diluent gas is hydrogen and the dopant precursor gas is boron trifluoride. In another preferred embodiment of the process of the instant invention, the precursor semiconductor gas is silicon tetrafluoride, the diluent gas is hydrogen and the dopant precursor gas is diborane. In still another preferred embodiment of the process of the instant invention, the precursor semiconductor gas is silicon tetrafluoride, the diluent gas is hydrogen and the dopant precursor gas is boron trifluoride. In a yet further preferred embodiment of the instant invention, the precursor semiconductor gas is silicon tetrafluoride and silane, the diluent is hydrogen and the dopant precursor gas is either boron trifluoride or diborane. In yet another preferred embodiment of the instant invention, the precursor semiconductor gas, the precursor dopant gas is as in the foregoing embodiments but the diluent gas comprises a mixture of hydrogen and an inert gas such as argon.

In accordance with another preferred embodiment of the instant invention, there is provided an electronic device of the type which includes at least one set of p-doped and n-doped semiconductor alloy regions. The improvement in the device comprises the addition of a p-doped semiconductor alloy region which is fabricated of a fluorinated microcrystalline wide band gap semiconductor alloy material. In one particular embodiment of the electronic device, a plurality of sets of p-doped and n-doped regions sandwich a substantially intrinsic semiconductor alloy region so as to form a p-i-n type photovoltaic cell. The p-doped microcrystalline semiconductor alloy material is characterized by a wide band gap so as to minimize losses due to series resistance in the tandem photovoltaic cell.

In accordance with still another preferred embodiment of the instant invention, there is provided a thin film transistor device including therein at least one region formed from a fluorinated, p-doped, microcrystalline semiconductor alloy material. In accordance with still another preferred embodiment of the instant invention, there is provided a CMOS thin film transistor including therein at least one layer of a fluorinated, p-doped, microcrystalline semiconductor alloy material.

DETAILED DESCRIPTION OF THE DRAWINGS

I. The Photovoltaic Cell

Figure 1:
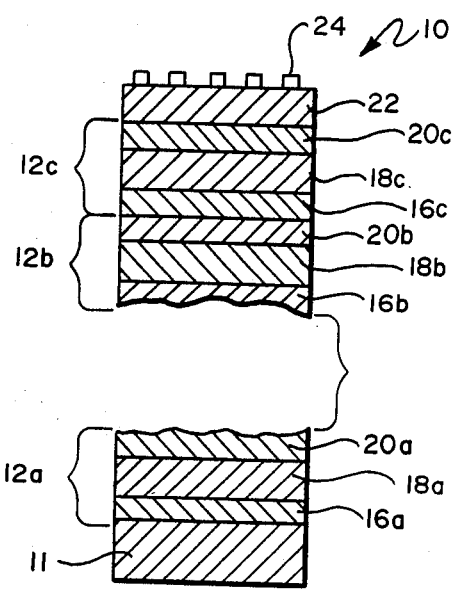
FIG. 1 is a fragmentary, cross-sectional view of a tandem photovoltaic device, said device comprising a plurality of p-i-n type cells, each layer of the cells formed from a semiconductor alloy material.

Referring now to the drawings and particularly to FIG. 1, a photovoltaic cell, formed of a plurality of successive p-i-n layers, each of which includes, preferably, a thin film semiconductor alloy material, and at least one of said layers formed of the p-doped, wide band gap, microcrystalline, fluorinated semiconductor alloy material of the instant invention, is shown generally by the reference numeral 10.

More particularly, FIG. 1 shows a p-i-n type photovoltaic device such as a solar cell made up of individual p-i-n type cells 12a, 12b, and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to application of the amorphous material, for purposes of this application, the term "substrate" shall include not only a flexible film, but also any elements added thereto by preliminary processing. Also included within the scope of the present invention are substrates formed of glass or a glass-like material on which an electrically conductive electrode is applied.

Each of the cells 12a, 12b, and 12c is preferably fabricated with a thin film semiconductor body containing at least a silicon alloy. Each of the semiconductor bodies includes an n-type conductivity semiconductor layer 20a, 20b, or 20c; a substantially intrinsic semiconductor layer 18a, 18b or 18c; and a p-type conductivity semiconductor layer 16a, 16b, or 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Also, although p-i-n photovoltaic cells are illustrated, the methods and materials of this invention may also be utilized to produce single or multiple n-i-p cells, p-n cells, Schottky barrier cells, as well as other semiconductor or devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 is adapted to shorten the carrier path and increase the conduction efficiency.

The Multiple Glow Discharge Deposition Chambers

Figure 2:
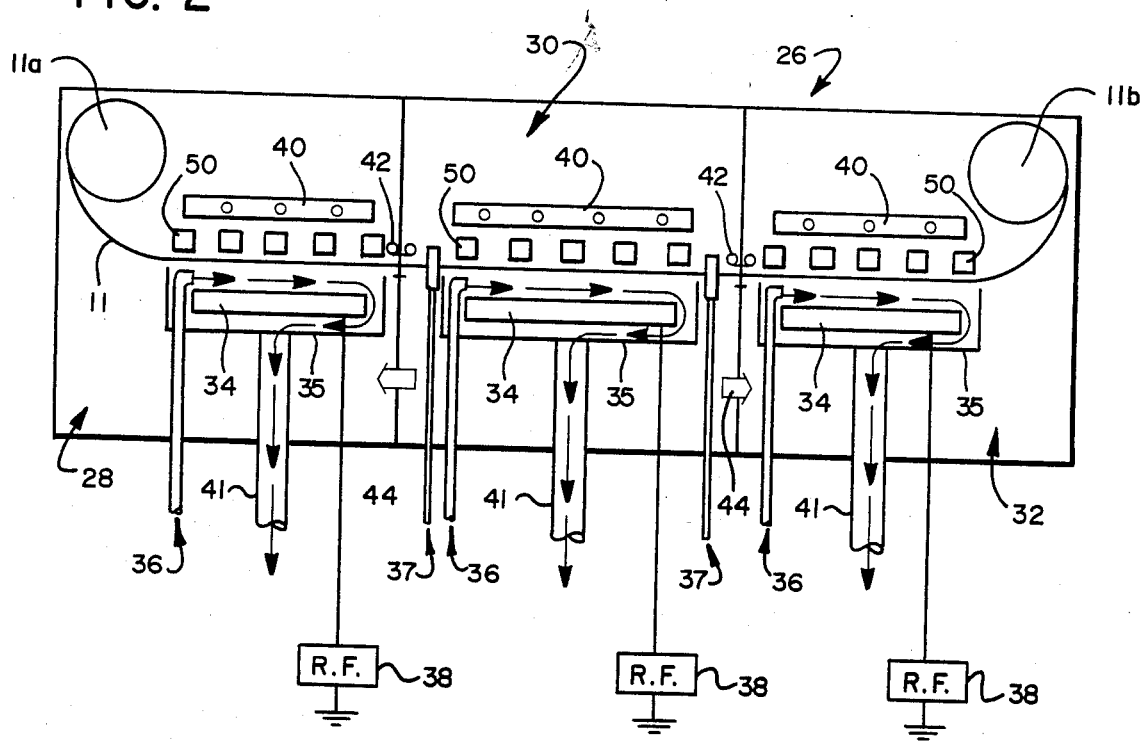
FIG. 2 is a schematic depiction of continuous deposition apparatus structured in accordance with the principles of the instant invention, said apparatus adapted to continuously deposit a plurality of successive, thin film layers of semiconductor alloy material upon a continuously advancing web of substrate material.

Turning now to FIG. 2, a diagrammatic representation of multiple glow discharge deposition apparatus for the continuous production of semiconductor cells is generally illustrated by the reference numeral 26. The apparatus 26 is illustrative of one type of glow discharge deposition system in which the microcrystalline, fluorinated, p-doped, wide band gap semiconductor alloy materials of the instant invention may be prepared, it being understood that such materials may also be prepared in other types of continuous and batch vacuum deposition systems as well as by other processes. The deposition apparatus 26 includes a plurality of isolated, dedicated deposition chambers, each chamber of which is interconnected by a gas gate 42 through which (1) sweep gases, and (2) a web of substrate material 11 are adapted to unidirectionally pass.

The apparatus 26 is adapted to mass deposit thin film semiconductor layers of p-i-n configuration onto the large area surface of the web of substrate material 11 which is continually fed therethrough. To deposit the layers of semiconductor material required for producing multiple p-i-n type cells, the apparatus 26 includes at least one triad of deposition chambers. Each triad of deposition chambers comprises: a first deposition chamber 28 in which p-type conductivity semiconductor alloy layer is deposited onto the deposition surface of the web of substrate material 11 as the web of substrate material 11 passes therethrough; a second deposition chamber 30 in which an intrinsic semiconductor alloy layer is deposited atop the p-type layer on the deposition surface of the web of substrate material 11 as the substrate 11 passes therethrough; and a third deposition chamber 32 in which an n-type semiconductor alloy layer is deposited atop the intrinsic layer on the deposition surface of the web of substrate material 11 as the web of substrate material 11 passes therethrough. It should be apparent that (1) although, only one triad of deposition chambers has been illustrated, additional triads or additional individual chambers may be added to the apparatus to provide the machine with the capability of producing photovoltaic cells having any number of p-i-n type semiconductor layers; (2) the substrate supply core 11a and the substrate take-up core 11b are shown in the deposition chambers for illustrative purposes only, while in reality the cores would be housed in separate chambers operatively connected to the deposition chambers; (3) although the glow discharge apparatus illustrated herein employs cathodes energized with r.f. power, other sources of electromagnetic energy, such as a.c. power generators, microwave generators and d.c. power generators, may be employed without departing from the spirit of the present invention; and (4) the process gases may be introduced to flow in a direction parallel but opposite to the direction of substrate travel.

Each deposition chamber 28, 30, and 32 of the triad is adapted to deposit a single semiconductor alloy layer, by glow discharge deposition, onto the electrically conductive web of substrate material 11. To that end, each of the deposition chambers 28, 30 and 32 includes: a cathode 34; a shield 35 disposed about each of the cathodes 34; a process gas supply conduit 36; a radio frequency generator or other electromagnetic power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber. Additionally, an inert sweep gas conduit 37 is disposed on opposed sides of the intrinsic deposition chamber for directing an inert gas toward the dopant deposition chambers.

The supply conduits 36 are operatively associated with the respective cathodes 34 or other decomposition mechanism to deliver process gas mixtures to the plasma, or other decomposition regions created in each deposition chamber between said decomposition mechanism and the web of substrate material 11. The cathode shields 35 are adapted to operate in conjunction with the web of substrate material 11 and the evacuation conduit 41 to confine the process gases within the cathode region of the deposition chambers. To this end, the shielding 35 abuts the cathode 34 in a leak-tight manner.

The radio frequency or other similar type of power generator 38 operates in conjunction with the cathodes 34, the radiant heaters 40 and the grounded web of substrate material 11 to form the plasma by disassociating and recombining the process gases entering the deposition chambers into deposition species and compounds. These species and compounds are then deposited onto the bottom surface of the web of substrate material 11 as semiconductor layers. The web of substrate material 11 is maintained substantially flat by the plurality of rows of magnetic elements 50 which provide an attractive force urging the web of substrate material 11 upwardly, out of its normal sagging path of travel.

To form the photovoltaic cell 10 illustrated in FIG. 1, the p-type, wide band gap fluorinated, microcrystalline semiconductor alloy layer of the instant invention is deposited onto the web of substrate material 11 in the p-dopant deposition chamber 28, a substantially intrinsic amorphous semiconductor alloy layer is deposited atop the p-type layer in the intrinsic deposition chamber 30 and an n-type amorphous semiconductor alloy layer is deposited atop the intrinsic layer in the n-dopant deposition chamber 32. As a result, in the preferred embodiment, the apparatus 26 deposits at least three amorphous semiconductor alloy layers onto the web of substrate material 11 with the intrinsic layer deposited in deposition chamber 30 differing in composition from the layers deposited in deposition chambers 28 and 32 by the absence of large amounts of at least one element which will be referred to as the dopant or doping species. Obviously, the apparatus 26 may be readily modified to produce photovoltaic cells of other combinations or configurations of semiconductor alloy layers. For example, by reversing the direction of travel of the web of substrate material 11, n-i-p configured cells may be manufactured. Also, be adding additional triads of deposition chambers, tandem photovoltaic cells comprising a multiplicity of superposed p-i-n or n-i-p cells may be manufactured.

III. The Microcrystalline, Fluorinated, P-Doped Wide Band Gap Semiconductor Alloy Material The semiconductor alloy material of the instant invention is a p-doped microcrystalline semiconductor alloy fabricated from a host matrix of silicon which further includes hydrogen and fluorine as well as a p-dopant material such as boron. It has been found that said fluorinated, p-doped microcrystalline semiconductor alloy material may be readily fabricated by glow discharge deposition, provided proper gaseous precursor materials are employed and proper deposition conditions are maintained. Great care must be taken in the introduction of gaseous precursor materials because of the many competing chemical reactions which can occur in the plasma generated in a glow discharge system, such as the plasma generated for the preparation of the thin semiconductor alloy films of the instant invention. Some of these reactions favor the growth or the deposition of the semiconductor alloy material, while other reactions favor the etching away of that deposited semiconductor alloy material. Applicants have found that in order to fabricate the microcrystalline semiconductor alloy material of the instant invention it is necessary to control said competing chemical reactions so as to control the relative rates of etching and deposition of that semiconductor alloy material. In accordance with the principles enumerated herein, it has been found that if the rate of growth of the semiconductor alloy species formed in the glow discharge plasma greatly exceeds the rate of etching of the depositing material, an amorphous semiconductor alloy film will be deposited onto the substrate, and obviously if the rate of etching of the depositing species of semiconductor alloy material far exceeds the rate of deposition, no semiconductor alloy film will be deposited. It is only when the growth of the semiconductor alloy material and the etching of that material occur at approximately similar rates, that microcrystalline semiconductor alloy material will be deposited.

In a typical glow discharge deposition process for the preparation of films of semiconductor alloy material, a process gas mixture is subjected to the effects of an electromagnetic field, which is developed between the cathode 34 and the web of substrate material 11 (described in detail hereinabove with reference to FIG. 2). A typical process gas mixture employed and introduced into the plasma region in the practice of the instant invention comprises (1) a gaseous precursor semiconductor material which serves to provide the semiconductor element or elements of the host matrix, (2) one or more gaseous density of states reducing elements which serve to reduce undesired electronic states in the band gap of the semiconductor alloy and thereby improve the electrical, chemical and optical properties of the resultant alloy, and (3) a gaseous precursor dopant material which introduces the dopant element into the matrix of the semiconductor alloy material; said gaseous precursor mixture referred to collectively herein as the reacting species. The gaseous precursor mixture also includes a gaseous precursor diluent, which may comprise a single component or a mixture of components, and which diluent serves to dilute the reacting species so as to introduce the optimum concentration and combination of said reacting species into the glow discharge plasma. Furthermore, in some cases the diluent gas is also adapted to assist in the actual decomposition and recombination of the reacting species, and in still other cases the diluent gas is also adapted to act as a density of states reducing element.

Applicants have found that in order to deposit high quality microcrystalline, p-doped, wide band gap, fluorinated, hydrogenated semiconductor alloys it is necessary to employ a gaseous precursor mixture which is highly dilute, that is to say, a mixture in which the reacting species of gaseous precursor material are present in relatively low concentration relative to the diluent gas. When such a dilute gaseous precursor mixture is utilized in a glow discharge deposition process, the deposition parameters can be controlled so as to insure that the rates of etching and growth are substantially similar and the deposition of a microcrystalline semiconductor alloy material results.

Typical gaseous precursor mixtures which can be employed in the practice of the instant invention to deposit a wide band gap, p-doped, fluorinated, hydrogenated microcrystalline semiconductor alloy material comprise from 0.1 to 1.0% of a gaseous precursor semiconductor alloy material such as silane, or silicon tetrafluoride, alone or in combination with germane and 0.02 to 0.4% of a gaseous precursor dopant material such as boron trifluoride or diborane diluted in a gaseous precursor diluent material such as hydrogen, argon or a mixture of the two. In other words. the ratio of boron trifluoride to silane is preferably about 40% while the ratio of diborane to silane is preferably about 4%. The typical depostion parameters which can be employed are a substrate temperature of about 150°-275° C., a pressure of about 0.5-2.0 torr, and r.f. power density of greater than about 300 milliwatts to 1.5 watts per centimeter squared.

One preferred microcrystalline semiconductor alloy material of the instant invention comprises an alloy formed of silicon:hydrogen:fluorine doped with boron. Because of the fact that the semiconductor alloy material is microcrystalline, it may be readily and efficiently doped so as to achieve extremely low activation energies, typically in the range of about 0.05 eV. According to the principles of the instant invention, examples of such p-doped, wide band gap, highly conductive, microcrystalline, fluorinated, hydrogenated semiconductor alloy material were prepared by the procedures outlined in the following examples.

EXAMPLE I

A gaseous precursor mixture comprising 0.25% silane, 0.08% boron trifluoride and 99.67% hydrogen was introduced into a glow discharge deposition deposition apparatus, generally similar to the p-dopant chamber 28 of the deposition apparatus 26 illustrated in and described with respect to FIG. 2, which p-dopant chamber was maintained at a pressure of approximately 0.6 torr. The substrate was heated to a temperature of approximately 275° C. and radio frequency energy of 13.56 MHz at a power of 20 watts was applied to the cathode 34 of the deposition apparatus 26 so as to initiate a glow discharge plasma therein. The aforementioned deposition conditions were maintained for about 30 minutes, at which time the electromagnetic energy was terminated and the deposition chamber raised to atmospheric pressure. The semiconductor alloy film thus deposited was approximately 600 angstroms thick. Measurements made via Raman spectroscopy and transmission electron microscopy confirm that the sample was indeed microcrystalline and that the crystallite size was within the range of 50-100 angstroms. The microcrystalline-silicon phase was estimated to be greater than about 80%. This is well above the percolation limit which explains the reason that the dark conductivity of the deposited alloy was so high. The thus prepared microcrystalline p-doped silicon:hydrogen:fluorine alloy had a dark conductivity of approximately 5.0 $ohm^{-1}$ $centimeters^{-1}$, as compared to (1) a conductivity of approximately $10^{-4}$ to $10^{-3}$ $ohm^{-1}$ $centimeter^{-1}$ for a corresponding amorphous p-doped, amorphous silicon:fluorine:hydrogen alloy, and (2) as compared to 0.1 $ohm^{-1}$ $centimeter^{-1}$ for the corresponding non-fluorinated microcrystalline silicon:hydrogen alloy prepared from diborane as the precursor gaseous source of p-doped material of Matsuda, et al. The activation energy of the p-doped microcrystalline silicon alloy was less than about 0.05 eV compared to 0.4 to 0.3 eV for said corresponding amorphous p-doped, silicon:-fluorine:hydrogen alloy sample. The optical gap of said sample was 2.0 eV as compared to 1.6 eV for an amorphous silicon:hydrogen:fluorine alloy sample and as compared to 1.8 eV for the corresponding p-doped microcrystalline silicon:hydrogen alloy of Matsuda, et al. The absorption constant at 5500 angstroms of light was about $3 \times 10^4 cm^{-1}$ as compared to $1 \times 10^5 cm^{-1}$ for the p-doped amorphous silicon:hydrogen:fluorine alloy sample. Finally, about 3.5% of fluorine was incorporated into the host matrix. Note that in all of the depositions outlined herein, the percentage of fluorine incorporated into the host matrix of the semiconductor alloy material was between 0.5 pk to 5.0% and typically greater than 1.0%.

EXAMPLE II

In this example two photovoltaic cells of an n-i-p configuration were prepared. The two cells were identical insofar as they each consisted of a stainless steel substrate having a layer of microcrystalline n-doped amorphous silicon alloy material deposited thereupon, a layer of amorphous, intrinsic silicon semiconductor alloy material deposited upon the n-doped layer so as to be generally coextensive therewith. The first one of the samples then had a layer of amorphous, p-doped, silicon:fluorine:hydrogen alloy material generally similar in structure and properties to the amorphous p-doped layer characterized in Example I, deposited atop the layer of amorphous intrinsic semiconductor alloy material. The second one of the samples had a layer of microcrystalline p-doped silicon:fluorine:hydrogen alloy material, which material was generally similar in structure and properties to the layer of microcrystalline p-doped semiconductor alloy material characterized in Example I, deposited atop of and generally coextensively with the layer of intrinsic semiconductor alloy material. The two photovoltaic cells thus fabricated were subjected to simulated solar illumination of approximately AM-1 intensity. The photoconversion parameters of the two photovoltaic cells are summarized in Table 1 below.

TABLE 1

| | Layer of Microcrystalline p-doped silicon:fluorine:hydrogen alloy | Layer of Amorphous p-doped silicon:fluorine:hydrogen alloy |
|---|---|---|
| Voc | 0.86 V | 0.72 V |
| Jsc | 13.3 MA/cm$^2$ | 12.0 MA/cm$^2$ |
| Fill factor | .605 | .58 |
| Efficiency | 6.76% | 5.0% |

As may be seen from the foregoing Table, the use of the microcrystalline, p-doped silicon:fluorine:hydrogen alloy layer improves photovoltaic cell performance in terms of open circuit voltage, short circuit current, and fill factor.

It should be noted that in the instant Example, the deposition apparatus employed to deposit the layers of semiconductor alloy material was not designed to optimize the efficiency of the photovoltaic cells fabricated therein. The deposition apparatus was actually a conglomeration of systems for depositing the individual semiconductor alloy layers, with the only object being to form a pair of photovoltaic cells which could be utilized to meaningfully compare the microcrystalline p-doped silicon:fluorine:hydrogen alloy layer of the instant invention with an amorphous p-doped layer.

EXAMPLE III

In this example, a relatively thin n-i-p type photovoltaic cell was formed upon a stainless steel substrate. This photovoltaic cell differs from the cell illustrated in and described with reference to FIG. 2 insofar as it was relatively thin, i.e. only approximately 1000 angstroms in total thickness. This relatively thin photovoltaic cell was specifically designed to be generally similar in thickness and chemical composition to the top cell utilized in tandem photovoltaic devices and was therefore fabricated to show the feasibility of utilizing the microcrystalline, p-doped, wide band gap, semiconductor alloy material of the instant invention as the p-doped layer in such a tandem photovoltaic device. The semiconductor alloy layers were all glow discharge deposited, pursuant to the parameters set forth in the foregoing examples. It was found that the relatively thin n-i-p photovoltaic cell thus produced generated an open circuit voltage of about 0.871 volts and a short circuit current of about 9.271 mA/cm$^2$ (the relatively low short circuit current output of the photovoltaic cell being attributable to the thinness of that cell). The fill factor of the photovoltaic cell was about 0.71 and the maximum power output of the one square centimeter cell was about 5.738 mW/cm$^2$.

EXAMPLE IV

Figure 3:
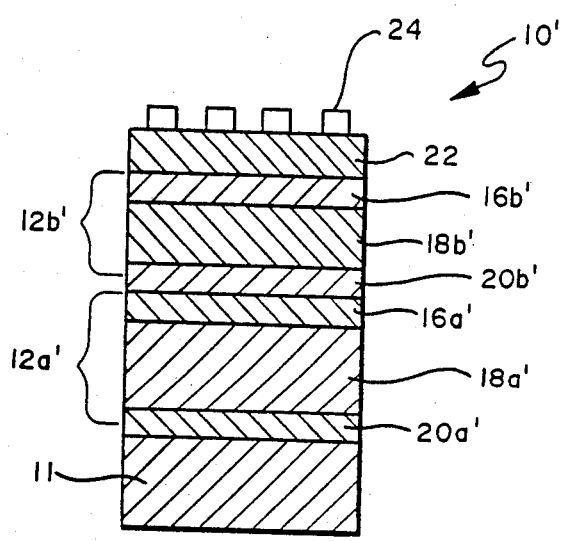
FIG. 3 is a cross-sectional view of a dual band gap tandem photovoltaic device similar to the device of FIG. 1, said device comprising two n-i-p cells; the p-doped layers of each cell formed from the fluorinated, wide band gap, microcrystalline semiconductor alloy material of the instant invention.

In this example, and with specific reference to FIG. 3, a tandem photovoltaic device is shown generally by the reference numeral 10'. The tandem photovoltaic device 10' is formed of two stacked n-i-p photovoltaic cells, 12a' and 12b', each cell incorporating the layer of fluorinated microcrystalline, p-doped, wide band gap semiconductor alloy material, 16a' and 16b', respectively, of the instant invention.

More specifically, the photovoltaic device 10 was formed by depositing a first n-doped semiconductor alloy (silicon:hydrogen:phosphorous) layer 20a' of about 250 angstroms thickness onto a stainless steel substrate 11, a first intrinsic semiconductor alloy (silicon:fluorine:hydrogen:boron (in trace amounts)) layer 18a' of about 3500 angstroms thickness atop the n-doped layer, a first p-doped microcrystalline semiconductor alloy (silicon:fluorine:hydrogen: boron) layer 16a' of about 75 angstroms thickness atop the intrinsic layer, a second n-doped semiconductor alloy (silicon:hydrogen:phosphorous) layer 20b' of about 75 angstroms thickness atop the first p-doped layer, a second intrinsic semiconductor alloy (silicon:fluorine:hydrogen:boron (in trace amounts)) layer 18b' of about 1000 angstroms thickness atop the second n-doped layer, a second p-doped semiconductor alloy (silicon:fluorine:hydrogen:boron) layer 16b' of about 50 angstroms thickness atop the second intrinsic layer, an ITO layer 22 of about 500 angstroms thickness atop the second p-doped layer and grid fingers 24 atop the ITO layer.

Note that the semiconductor alloy layers were glow discharge deposited from precursor gas mixtures of (1) silane, hydrogen, and phosphine to form the n-doped semiconductor alloy layers; (2) silane, hydrogen, and trace amounts of boron trifluoride to form the intrinsic semiconductor alloy layer and (3) silane, hydrogen and boron trifluoride to form the p-doped semiconductor alloy layers.

Although, in an optimized tandem photovoltaic device, each one of the plurality of photovoltaic cells thereof are preferably fabricated to be responsive to different portions of the solar spectrum, in this example the two photovoltaic cells 12a' and 12b' were formed of semiconductor alloy materials having generally similar band gaps. The object of the fabrication of this particularly configured (same band gap) photovoltaic device was only to demonstrate that additional layers of semiconductor alloy material may be disposed atop the fluorinated, p-doped, wide band gap, microcrystalline semiconductor alloy material of the instant invention without adversely effecting at the interface developed therebetween. The two stacked n-i-p type photovoltaic cells 12a' and 12b' of this example were generally similar to the p-i-n photovoltaic cells 12a and 12b of FIG. 1. Open circuit voltage of the tandem photovoltaic cell was about 1.652 volts and the fill factor was about 0.698, thereby indicating that a good tunnel junction was present between the layer of p-doped, wide band gap microcrystalline semiconductor alloy material 16a' of the lower photovoltaic cell 12a' and the layer of n-doped semiconductor alloy material 20b' of the upper photovoltaic cell 12b'. If interface problems had occured therebetween, it would be expected that the series resistance of the tandem photovoltaic cell 10' would be high, and the open circuit voltage and the fill factor thereof would be low. Furthermore, when a short circuit current versus open circuit voltage plot (known to those well versed in the art as an I-V plot) is sketched for such tandem photovoltaic devices, a low quality junction between the upper and lower photovoltaic cells comprising the tandem photovoltaic device is manifested as a kink in the first quadrant of the otherwise smoothly rising I-V plot. No such kink was present for the tandem photovoltaic device of the instant example. While the short circuit current of the tandem photovoltaic device was only about 5.01 mA/cm$^2$, the short circuit current was expected to be low owing to the fact that the two photovoltaic cells, 12a' and 12b', from which the photovoltaic device 10' was fabricated had similar band gaps. Therefore, most of the light was captured in the upper photovoltaic cell 12b' and the lower photovoltaic cell 12a' was unable to generate much current.

Example V

In this example, an n-i-p-type photovoltaic device 10' was fabricated identical to the device described with respect to FIG. 3, except that the lower photovoltaic cell 12a' thereof was glow discharge deposited with a narrow band gap intrinsic semiconductor alloy layer of silicon:germanium:fluorine:hydrogen:boron (in trace amounts) alloy material 18a'. It is this type of narrow band gap lower photovoltaic cell 12a' which would be utilized in conjunction with a superposed wider band gap photovoltaic cell 12b' such as the aforedescribed silicon:fluorine:hydrogen:boron (in trace amounts) alloy material to fabricate an efficient dual tandem photovoltaic device. The narrow band gap photovoltaic cell 12a' was fabricated by a glow discharge process generally similar to that process described with reference to FIG. 1; however, a gaseous mixture of silane, germane, hydrogen, silicon tetrafluoride, and boron trifluoride was employed for the deposition of the layer of intrinsic silicon:germanium alloy material. The n-doped and p-doped layers of semiconductor alloy material were generally similar to those described in the foregoing examples. The tandem n-i-p photovoltaic cell 10' thus produced had an open circuit voltage of about 0.806, as compared to 0.72 V for photovoltaic cells of this type fabricated with a layer of amorphous p-doped semiconductor alloy material. The short circuit was about 15.165 mA/cm², the maximum power output was about 0.684 mW/cm², and the fill factor was 0.547. The somewhat low fill factor was due to the inadvertant incorporation of trace amounts of phosphorous into the layer of intrinsic semiconductor alloy material, which was in turn, due to the fact that said intrinsic semiconductor alloy layer was deposited immediately following the deposition of the n-doped layer instead of immediately following the deposition of the p-doped layer.

EXAMPLE VI

Figure 4:
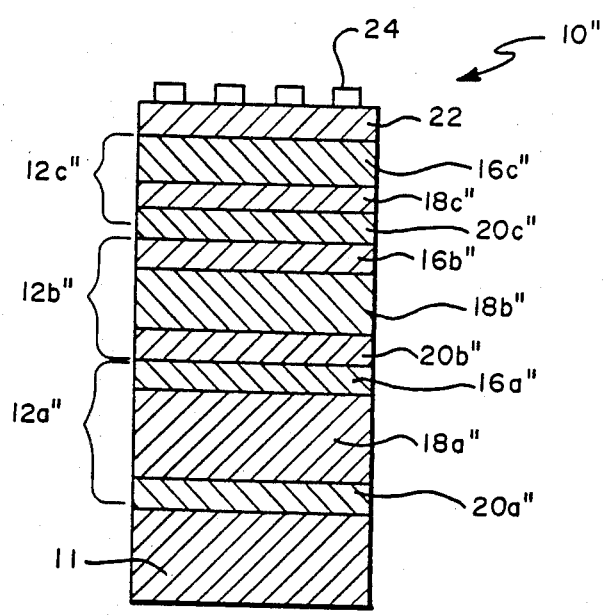
FIG. 4 is a cross-sectional view of a dual band gap tandem photovoltaic device similar to the device of FIG. 1, said device comprising three n-i-p cells; the p-doped layers of each cell formed from the fluorinated, wide band gap, microcrystalline semiconductor alloy material of the instant invention.

In this example, and with specific reference to FIG. 4, a tandem photovoltaic device is shown generally by the reference numeral 10". The tandem photovoltaic device 10" is formed of three stacked n-i-p photovoltaic cells, 12a", 12b", and 12c", each cell incorporating the layer of fluorinated microcrystalline, p-doped, wide band gap semiconductor alloy material 16a", 16b," and 16c" respectively, of the instant invention.

More specifically, the photovoltaic device 10" is formed by depositing a first n-doped semiconductor alloy (silicon:hydrogen:phosphorous) layer 20a" of about 300 angstroms thickness onto a stainless steel substrate 11, a first intrinsic semiconductor alloy (silicon:germanium:hydrogen) layer 18a" of about 3500 angstroms thickness atop the n-doped layer, a first p-doped semiconductor alloy (silicon:fluorine:hydrogen:-boron) layer 16a" of about 100 angstroms thickness atop the intrinsic layer, a second n-doped semiconductor alloy (silicon:hydrogen:phosphorous) layer 20b" of about 100 angstroms thickness atop the first p-doped layer, a second intrinsic semiconductor alloy (silicon:-hydrogen) layer 18b" of about 2000 angstroms thickness atop the second n-doped layer, a second p-doped semiconductor alloy (silicon:fluorine:hydrogen:boron) layer 16b" of about 100 angstroms thickness atop the second intrinsic layer, a third n-doped semiconductor alloy (silicon:hydrogen:phosphorous) layer 20c" of about 100 angstroms thickness atop the second p-doped layer, a third intrinsic semiconductor alloy (silicon:hydrogen) layer 18c" of about 500 angstroms thickness atop the second n-doped layer, a second p-doped semiconductor alloy (silicon:fluorine:hydrogen:boron) layer 16c" of about 80 angstroms thickness atop the second intrinsic layer, an ITO layer 22 of about 600 angstroms thickness atop the second p-doped layer and grid fingers 24 atop the ITO layer. Again note that the semiconductor alloy layers were glow discharge deposited from precursor gas mixtures of (1) silane, hydrogen, phosphine, and argon to form the n-doped semiconductor alloy layers; (2) silane, hydrogen, germane, and argon to form the lowest intrinsic semiconductor alloy layer, (3) silane, hydrogen, and argon to form the upper intrinsic semiconductor alloys layer and (4) silane, hydrogen, and boron trifluoride to form the p-doped semiconductor alloy layers. Further note that the lower intrinsic semiconductor alloy layer is graded so that the upper one hundred angstroms thereof is deposited from the aforementioned precursor semiconductor alloy mixture minus germane so as to field profile that layer. In this manner, the first deposited cell 12a" has a band gap of about 1.5 eV and the second and third cells 12b" and 12c" has a band gap of 1.7 eV.

Again, although, in an optimized photovoltaic device, each one of the plurality of photovoltaic cells thereof would be fabricated to be responsive to different portions of the solar spectrum, in this example, only the lower photovoltaic cell 12a" is formed of semiconductor alloy material having a band gap different from the band gap of the upper two photovoltaic cells 12b" and 12c". The three stacked n-i-p type photovoltaic cells 12a", 12b", and 12c" of this example were generally similar to the p-i-n photovoltaic cells 12a' and 12b' of FIG. 3. The open circuit voltage of the triple tandem photovoltaic cell 10" was about 2.59 volts, the fill factor was about 0.716, the short circuit current of the cell 10" was about 5.37 milliamps per centimeter squared and the efficiency was a world's record 9.958%.

Other Electronic Devices

In addition to the fabrication of highly efficient photovoltaic devices, the fluorinated, p-doped, wide band gap, microcrystalline semiconductor alloy material of the instant invention may be advantageously employed in the fabrication of other types of electronic devices. For example, memory arrays comprising a plurality of thin film diodes will have the performance thereof enhanced in a manner analogous to the manner in which the efficiency of the photovoltaic devices were enhanced as a result of the incorporation of the microcrystalline material thereonto. Also, thin film transistors such as field effect transistors, as well as arrays of transistors, including CMOS transistors would similarly benefit by incorporating the p-doped microcrystalline material.

In summary then, the fluorinated, p-doped, microcrystalline semiconductor alloy material of the instant invention exhibits high electrical conductivity and may therefore be efficiently doped to provide low activation energies and substantially degenerate behavior. Because of that high conductivity, the ease with which the microcrystalline material can establish ohmic contact to a wide variety of the semiconductor alloy materials, and the fact that p-doped microcrystalline material can be fabricated in a continuous process which is compatible with the process for fabricating the other layers of amorphous semiconductor alloy material, the microcrystalline semiconductor alloy material of the instant invention may be advantageously employed to form contacts, circuit lines, bus bars and other types of conductive members employed in the manufacture of integrated circuits.

As mentioned in the foregoing description of the invention, other configurations of layers of semiconductor alloy material, such as an n-i-p configuration, may be fabricated utilizing the p-doped, fluorinated, microcrystalline semiconductor alloy material of the instant invention. It must be specifically noted that an n-i-p configuration, i.e., substrate/n-doped layer/intrinsic layer/p-doped layer, is actually preferred. This is because the p-doped semiconductor alloy layer can now be fabricated to have a wide band gap so as to pass incident light to the intrinsic semiconductor alloy layer of the photovoltaic cell. Since the maximum amount of light absorption occurs at the top of the intrinsic semiconductor alloy layer of the cell, the charge carriers of poorest mobility (the holes) are then generated closest to the collecting electrode thereof.

The foregoing description is merely meant to be illustrative of the instant invention, and not a limitation upon the practice thereof. Numerous variations and modifications of the disclosed embodiments of the instant invention are possible. It is the following claims, including all equivalents, which define the scope of the instant invention.

What is claimed is:

1. A fluorinated p-doped microcrystalline silicon alloy material having an optical gap wider than the band gap of the corresponding amorphous silicon alloy material.

2. A material as in claim 1, wherein the the p-dopant is boron.

3. A material as in claim 2, further including hydrogen.

4. A material as in claim 1, characterized by an activation energy of less than approximately 0.05 eV.

5. A material as in claim 1, characterized by a conductivity of greater than 1 ohms$^{-1}$−cm$^{-1}$.

6. A material as in claim 1, characterized by an optical gap of approximately 2.0 eV.

7. A material as in claim 1, characterized by an absorption constant at 5500 angstroms of less than about $3 \times 10^4$ cm$^{-1}$.

8. A material as in claim 1, characterized by microcrystalline inclusions amounting to at least about 80% in the amorphous network.

9. A material as in claim 1, characterized by at least about 1% fluorine incorporated into the silicon alloy material.

10. In an electronic device of the type which includes at least one set of p-doped and n-doped silicon alloy regions, the improvement comprising, in combination:
the p-doped silicon alloy region including a fluorinated microcrystalline silicon alloy material having an optical gap wider than the band gap of the corresponding amorphous silicon alloy material.

11. A device as in claim 10, wherein the the p-dopant is boron.

12. A device as in claim 11, wherein the p-doped region further includes hydrogen.

13. A device as in claim 10, wherein the p-doped region is characterized by an activation energy of less than approximately 0.05 eV.

14. A device as in claim 10, wherein the p-doped region is characterized by a conductivity of greater than 0.5 ohms$^{-1}$−cm$^{-1}$.

15. A device as in claim 10, wherein the p-doped region is characterized by an optical gap of approximately 2.0 eV.

16. A device as in claim 10, wherein the p-doped region is characterized by an absorption constant at 5500 angstroms of less than about $3 \times 10^4$ cm$^{-1}$.

17. A device as in claim 10, wherein each of the at least one set of p-doped and n-doped regions sandwich a substantially intrinsic silicon alloy region so as to form a photovoltaic cell.

18. A device as in claim 17, wherein a tandem photovoltaic cell is fabricated by the superposed regions.

19. A device as in claim 17, wherein the photovoltaic cell is a metal-n-i-p type, characterized by an open circuit voltage of at least 0.85 volts and a short circuit current of at least 12.5 milliamperes per square centimeter.

20. A device as in claim 10, wherein the microcrystaline material includes microcrystalline inclusions amounting to at least about 80% in the amorphous network.

21. A device as in claim 10, wherein at least about 1% fluorine is incorporated into the microcrystalline semiconductor alloy material.

22. A semiconductor alloy material comprising a microcrystalline host matrix of silicon, said host matrix having incorporated thereinto at least one density of states reducing element and a p-dopant element the optical gap of the p-doped, state-reduced, microcrystalline silicon alloy material being wider than the band gap of the corresponding amorphous silicon alloy material.

23. A material as in claim 22, wherein the p-dopant is boron.

24. A material as in claim 22, wherein the host matrix further includes hydrogen.

25. A material as in claim 22, wherein the at least one density of states reducing element includes fluorine.

26. A material as in claim 22, characterized by an activation energy of less than approximately 0.05 eV.

27. A material as in claim 22, characterized by a conductivity of greater than 1 ohms$^{-1}$−cm$^{-1}$.

28. A material as in claim 22, characterized by an optical gap of approximately 2.0 eV.

29. A material as in claim 22, characterized by an absorption constant at 5500 angstroms of less than about $3 \times 10^4$ cm$^{-1}$.

30. A material as in claim 22, characterized by microcrystalline inclusions amounting to at least about 80% in the amorphous network.

31. A material as in claim 22, characterized by at least about 1% fluorine incorporated into the host matrix.

32. In a photovoltaic device of the type which includes at least two superposed cells, each cell including a p-doped semiconductor alloy layer therein, the improvement comprising:
the p-doped layer of at least one of said at least two cells formed of a fluorinated p-doped microcrystalline silicon alloy material having an optical gap wider than the band gap of the corresponding amorphous silicon alloy material.

33. A photovoltaic device as in claim 32, wherein alloy and the p-dopant is boron.

34. A photovoltaic device as in claim 32, wherein said microcrystalline silicon alloy further includes hydrogen.

35. A photovoltaic device as in claim 32, wherein said microcrystalline silicon alloy is characterized by an activation energy of less than approximately 0.05 eV.

36. A photovoltaic device as in claim 32, wherein said microcrystalline silicon alloy is characterized by an optical gap of approximately 2.0 eV.

37. A photovoltaic device as in claim 32, wherein said microcrystalline silicon alloy is characterized by an absorption constant at 5500 angstroms of less than about $3 \times 10^4 cm^{-1}$.

38. A photovoltaic device as in claim 32, wherein the microcrystalline material includes microcrystalline inclusions amounting to at least about 80% in the amorphous network.

39. A photovoltaic device as in claim 32, wherein at least about 1% fluorine is incorporated into the microcrystalline silicon alloy material.

40. A method of fabricating a fluorinated, p-doped microcrystalline semiconductor alloy material having an optical gap wider than the band gap of the corresponding amorphous semiconductor alloy material, said process including the steps of:

depositing a semiconductor alloy film upon a substrate through the glow discharge of a gaseous mixture of at least a precursor silicon gas, a dopant precursor gas, and a diluent gas; at least one of said precursor gases including fluorine;

introducing said gaseous mixture in approximately the following proportions: (1) less than about one percent of the precursor silicon gas, (2) more than about 98 percent of the diluent gas, and (3) less than about one percent of the precursor p-dopant gas.

41. A method as in claim 40, including the step of introducing silane, or silane and germane, or silicon tetrafluoride, or silicon tetrafluoride and germane into the gaseous mixture as the precursor silicon gas.

42. A method as in claim 41, including the step of introducing boron trifluoride or diborane into the gaseous mixture as the precursor p-dopant gas.

43. A method as in claim 42, including the step of introducing hydrogen gas or argon into the gaseous mixture as the diluent gas.

44. A method as in claim 43, including the further steps of maintaining a substrate temperature of about 250° C., a pressure of less than 0.5 torr and a relatively high power of r.f. energy.

45. A method as in claim 44, including the further steps of also depositing an intrinsic semiconductor alloy layer and an n-doped semiconductor alloy layer so as to fabricate a p-i-n type photovoltaic cell characterized by a wide band gap p-doped silicon alloy layer.

46. A method as in claim 45, including the further step of depositing at least one additional set of semiconductor alloy layers so as to fabricate a tandem p-i-n type photovoltaic device.

* * * * *

UNITED STATES PATENT AND TRADEMARK OFFICE
Certificate

Patent No. 4,600,801                                    Patented July 15, 1986

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is Subhendu Guha, James Kulman, and Stanford R. Ovshinsky.

Signed and Sealed this 3rd Day of February, 1987.

BRADLEY R. GARRIS,
*Office of the Deputy Assistant
Commissioner for Patents.*